(12) United States Patent
Kanakasabapathy et al.

(10) Patent No.: US 9,472,447 B1
(45) Date of Patent: Oct. 18, 2016

(54) CONFINED EPTAXIAL GROWTH FOR CONTINUED PITCH SCALING

(71) Applicant: INTERNATIONAL BUSINESS MACHINES CORPORATION, Armonk, NY (US)

(72) Inventors: Sivananda K. Kanakasabapathy, Niskayuna, NY (US); Balasubramanian Pranatharthiharan, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/972,228

(22) Filed: Dec. 17, 2015

(51) Int. Cl.
*H01L 21/762* (2006.01)
*H01L 27/092* (2006.01)
*H01L 21/8238* (2006.01)

(52) U.S. Cl.
CPC . *H01L 21/76224* (2013.01); *H01L 21/823821* (2013.01); *H01L 27/0924* (2013.01)

(58) Field of Classification Search
CPC .............. H01L 21/823821; H01L 27/0924; H01L 29/7855; H01L 21/76224
See application file for complete search history.

(56) References Cited

U.S. PATENT DOCUMENTS

| | | | |
|---|---|---|---|
| 8,697,523 B2 | 4/2014 | Cai et al. | |
| 8,941,156 B2 | 1/2015 | Bergendahl et al. | |
| 9,040,380 B2 | 5/2015 | Hu et al. | |
| 9,054,218 B2 | 6/2015 | Adam et al. | |
| 9,196,613 B2* | 11/2015 | Basker | H01L 27/0924 |
| 9,219,153 B2* | 12/2015 | Xie | H01L 29/785 |
| 2013/0181264 A1 | 7/2013 | Liao et al. | |
| 2015/0137308 A1* | 5/2015 | Akarvardar | H01L 27/0886 257/506 |
| 2015/0145048 A1* | 5/2015 | Cheng | H01L 27/1211 257/351 |
| 2015/0214219 A1 | 7/2015 | Cai et al. | |
| 2015/0228761 A1 | 8/2015 | Cheng et al. | |

* cited by examiner

*Primary Examiner* — Jose R Diaz
(74) *Attorney, Agent, or Firm* — Cantor Colburn LLP; Steven Meyers (57) ABSTRACT

A technique relates to manufacturing a finFET device. A plurality of first and second semiconductor fins are formed on a substrate. Gate stacks are formed on the substrate, each including a gate, a hard mask and an oxide layer. A dielectric spacer layer is deposited. A sacrificial fill material is deposited on the finFET device and planarized. A second hard mask is deposited, a trench area is patterned in the hard mask parallel to the first and second semiconductor fins, and the sacrificial fill material is anisotropically etched to create a trench. A dielectric wall is formed in the trench and the second hard mask and sacrificial fill material are removed.

14 Claims, 12 Drawing Sheets

CONFINED EPTAXIAL GROWTH FOR CONTINUED PITCH SCALING

BACKGROUND

The present invention relates to fin field-effect transistor (FinFET) devices, and more specifically, to fully confined epitaxial growth for continued pitch scaling in FinFET devices.

Epitaxy is often used to merge individual fins that belong to a single transistor in order to provide enough material in the source drain for silicidation as well as to relax the requirements on a contact. Conventional epitaxy processes are not self-limited. This means that there is a variation in epitaxy thickness based on the fin-to-fin spacing to ensure that all fins that need to be merged are merged.

However, there is a need to avoid unwanted shorts between neighboring transistors, such as neighboring n-type field effect (nFET) transistors and p-type field effect (pFET) transistors, as well as a source to drain shorts caused by the merging of fins of different transistors. The variation in the epitaxy thickness makes it difficult to design growth rates to avoid the unwanted shorts. Known methods have employed extra spacing between neighboring transistors or have employed fin height scaling. However, extra spacing, for example, is not compatible with area and performance scaling.

There is a need for an improved method for finFET manufacture that prevents the unwanted shorts between n-FET and p-FET transistor regions.

SUMMARY

According to an embodiment of the present disclosure, method for manufacturing a finFET device includes forming a plurality of first transistor fins on a substrate. The method also includes forming a plurality of second transistor fins on a substrate. The method also includes forming one or more gate stacks, each gate stack including a gate, a first hard mask, and an oxide layer. The method also includes depositing a low-k dielectric spacer layer on the finFET device. The method also includes depositing a sacrificial fill material on the finFET device. The method also includes planarizing the device with chemical mechanical planarization to the level of the liner on top of the gate stacks. The method also includes depositing a second hard mask on the finFET device. The method also includes patterning a trench area in the second hard mask parallel to the first transistor fins and second transistor fins. The method also includes anisotropically etching the sacrificial fill material to create a trench. The method also includes forming a dielectric wall in the trench. The method also includes removing the second hard mask from the finFET device. The method also includes selectively removing the sacrificial fill material and removing the first hard mask from the finFET device.

According to another embodiment of the present disclosure, a method of manufacturing a finFET device includes patterning a plurality of first fins on a first transistor area and a plurality of second fins on a second transistor area. The method also includes forming two gate stacks, each gate stack comprising sacrificial gate material, a hard mask, and an oxide layer. The method also includes subtractively patterning a dielectric wall between the first fins and second fins. The method also includes growing a first epitaxial layer on the first transistor area, wherein the first epitaxial layer is confined to the first transistor area by the dielectric wall.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A-I illustrate an exemplary method of making a FinFET device according to a first embodiment, in which:

DETAILED DESCRIPTION

Figure 1A:
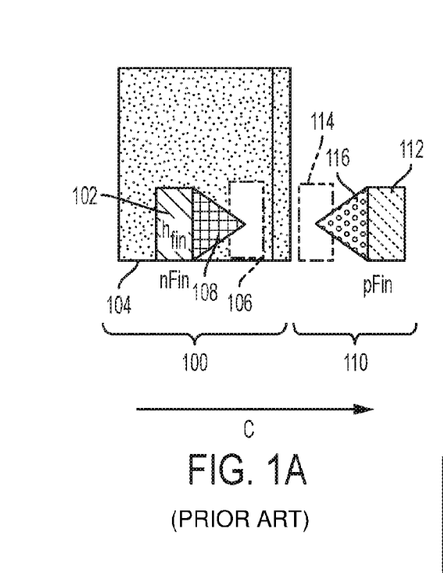
FIG. 1A illustrates a top-down view of a conventional 14 nanometer FinFET transistor.
Figure 1B:
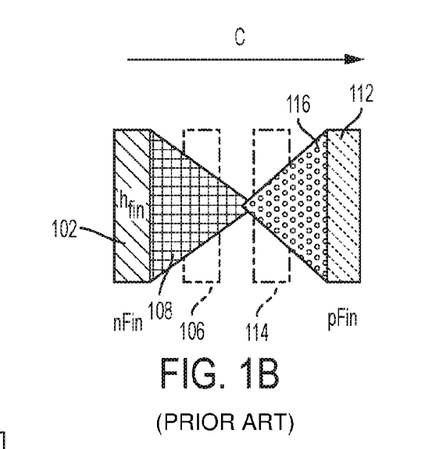
FIG. 1B illustrates a top-down view of a conventional transistor with a source-drain short from epitaxial overlap.
Figure 1C:
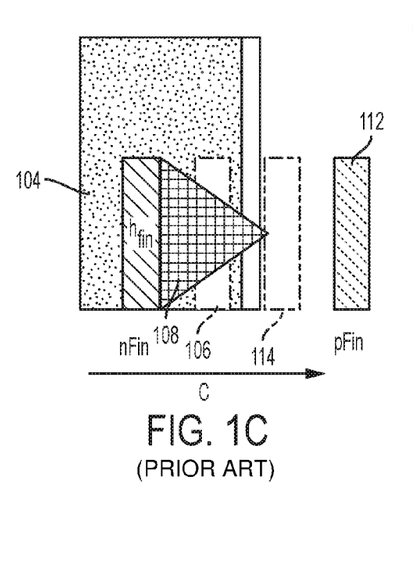
FIG. 1C illustrates a top-down view of a conventional transistor with epitaxial growth into an adjacent transistor.
Figure 1D:
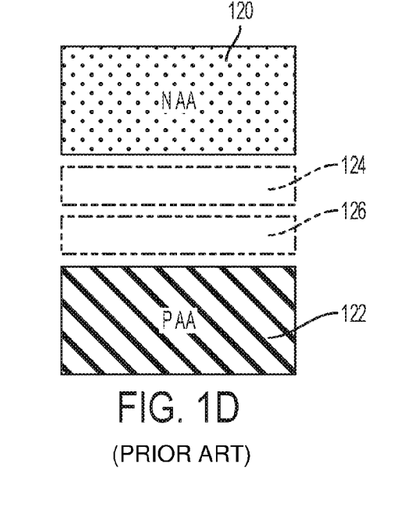
FIG. 1D illustrates a conventional approach to avoiding source-drain shorts.

Scaling of FinFET devices calls for consideration of epitaxial growth areas. As shown in FIG. 1A, conventional FinFET devices using epitaxial layers include an nFET area 100 containing an n-type fin (nFin) 102 and a pFET area 110 including p-type fin (pFin) 112. One or more epitaxial layers can be grown on a substrate in the transistor area. For example, as shown in FIG. 1A, an nFET epitaxial layer 108 can be grown in the nFET area 100 by an epitaxial growth process starting from the nFin 102. In some cases, a second epitaxial layer, for instance a pFET epitaxial layer 116, can be grown in an adjacent transistor area. Each transistor has an active area. For example, nFin 102 has active area 104 associated with an epitaxial current and gate resistance. The first and second transistor areas can be a source and a drain. Conventional device manufacture uses advanced channel materials and fin height scaling to achieve performance scaling. However, area and performance scaling drive fin pitch scaling. Conventional devices call for lateral spacing between transistors to avoid shorts and other issues. For example, an nFin and pFin can be positioned such that at least two fin spaces 106 and 114, commensurate in area with the size of the fins, separate the fins. Crystallographic proportionality between fin height and lateral epitaxial growth, where the lateral direction is shown in FIGS. 1A-C as the c-direction, can give rise to epitaxy to epitaxy source drain shorts. For example, as shown in FIG. 1B, nFET epitaxial layer 108 and pFET epitaxial layer 116 can overlap, resulting in a short. Moreover, in some cases, errors in placement of masks during patterning can result in epitaxial growth into undesired transistor areas. For example, as depicted in FIG. 1C, an unconfined nFET epitaxial layer 108 can grow into the pFET area 110. A conventional solution is illustrated in FIG. 1D. As shown, an nFET active area 120 is adjacent to a pFET active area 122. These active areas are separated by a two fin gap, which is a gap that includes an area proportional to the size of the nFIN 124 and an area proportional to the size of the pFIN 126. This conventional solution is incompatible with continued pitch scaling.

Accordingly, embodiments of the disclosure provide methods of making FinFET devices that can confine epitaxial growth. The methods of the disclosure include forming a dielectric wall separating adjacent transistor regions to confine subsequent epitaxial growth.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

FIGS. 2A-I illustrate an exemplary method of making a FinFET device according to a first embodiment of the present disclosure.

Figure 2A:
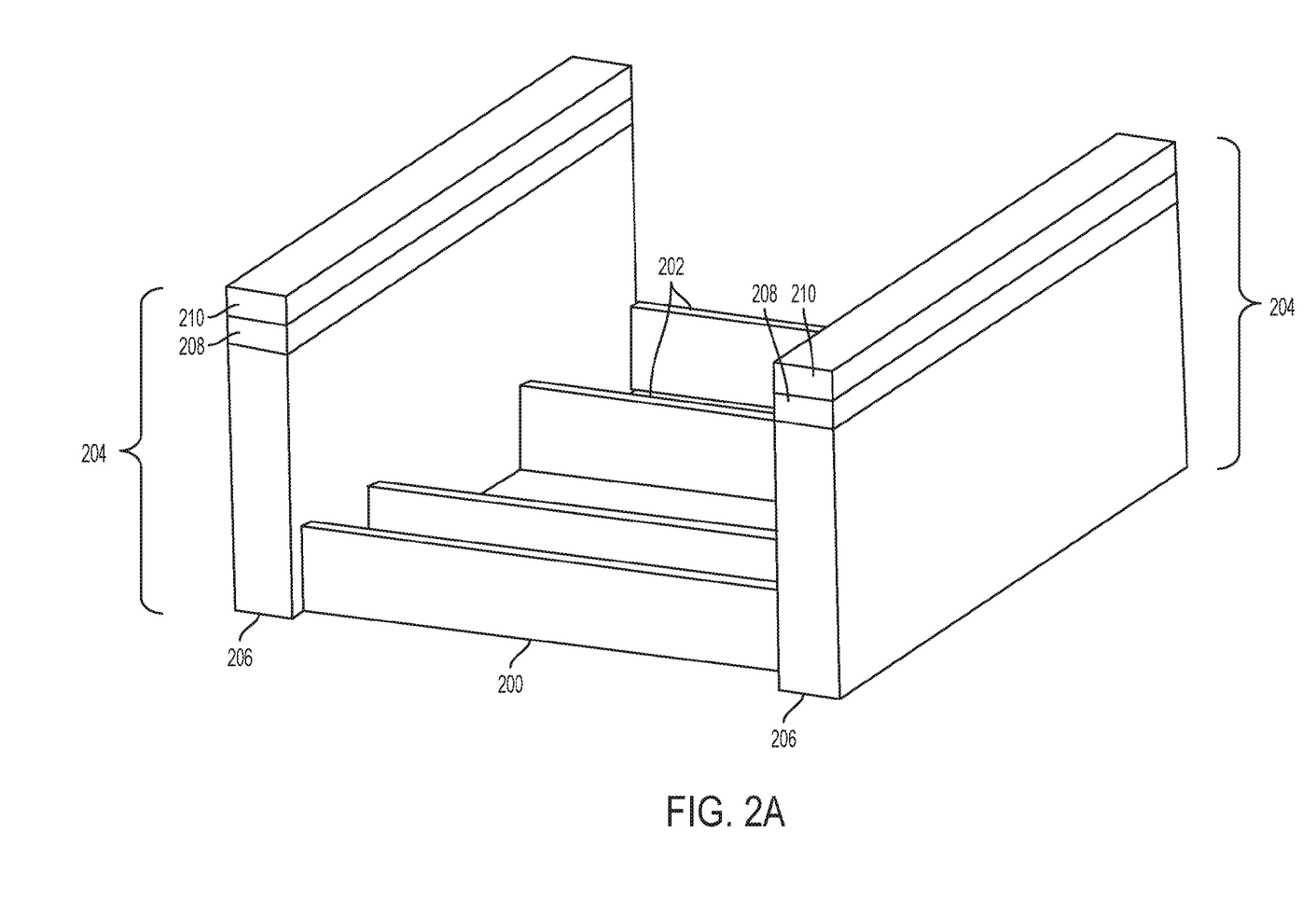
FIG. 2A is a perspective view of a FinFET device after fins and gate stacks are patterned on a substrate according to an exemplary embodiment.

In a first embodiment, as illustrated in FIG. 2A, a transistor is formed with a plurality of first transistor fins 200 and a plurality of second transistor fins 202 patterned on a substrate (not shown) by known methods, such as multiple patterning techniques. For example, the transistor fins 200 and 202 can be patterned by self aligned double patterning (SADP) or self aligned quadruple patterning (SAQP) with active silicon region (RX) and fin cut (FC) layer formation. In some embodiments, for example, the first transistor fins 200 are pFET fins and the second transistor fins 202 are nFET fins.

Multiple gate stacks 204 are patterned on the transistor, each gate stack having a gate 206, a first hard mask 208, and an oxide layer 210. The gate 206 can be a sacrificial gate containing, for example, polysilicon oxide, germanium or silicon germanium, and/or a nonmetal. In preferred embodiments, a first part of a double-patterning process for forming sacrificial gate structures is used. Double-patterning processes for forming sacrificial gate structures are known and include, for example, patterning a multilayer stack structure including a polysilicon layer and a hard mask on top of the polysilicon layer. A hard-mask open etch process can etch the pattern of the gate lines into the hard mask layer. In some embodiments, a cut lithography (CT) process, which could be the second patterning process of a conventional double patterning process, is not performed at this step. The first hard mask 208 can be a liner or spacer material with low wet etch resistance, such as a silicon nitride, silicon oxide, or mixtures thereof. In preferred embodiments, the first hard mask 208 comprises a composite silicon nitride/silicon oxide material. The first hard mask can be deposited by PVD deposition, for example.

A substrate can include any silicon containing substrate including, but not limited to Si, bulk Si, single crystal Si, crystalline Si, SiGe, amorphous Si, silicon-on-insulator substrates (SOI), SiGe-on-insulator (SGOI), strained-silicon-on-insulator, annealed poly Si, and poly Si line structures. A source and drain can be implanted in the substrate.

As used herein, "depositing" may include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

Figure 2B:
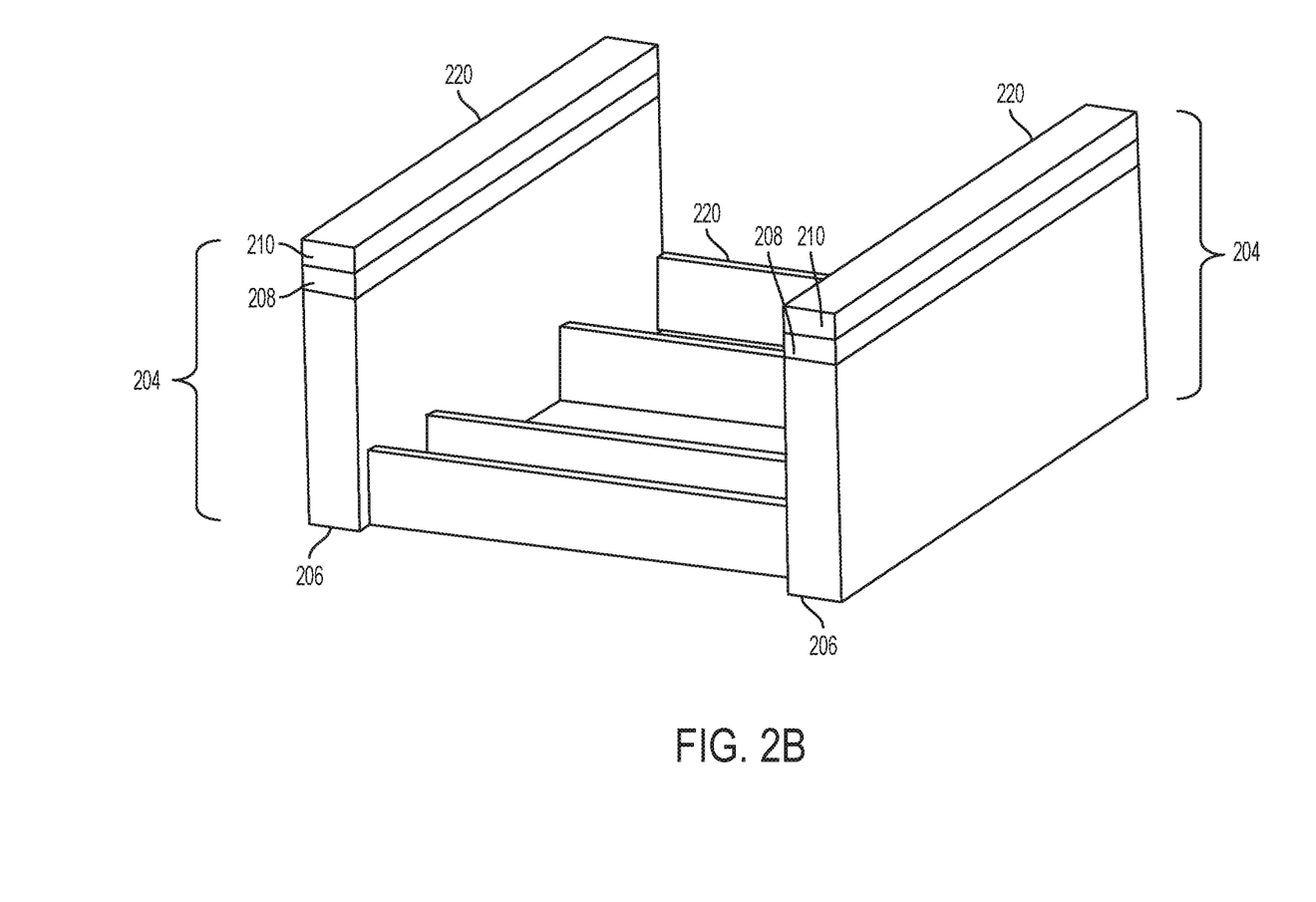
FIG. 2B is a perspective view of a FinFET device after depositing a dielectric spacer according to an exemplary embodiment.

Next, in accordance with the first embodiment, as shown in FIG. 2B, an exemplary method includes depositing a spacer layer 220 on the finFET device. In some embodiments, the spacer layer 220 contains a low-k spacer material, such as a poly-open chemical mechanical polish (POC) liner. A low-k spacer is a spacer having a dielectric constant less than the dielectric constant of silicon nitride at room temperature. Examples of low-k materials include, but are not limited to, SiBCN, hydrogen silsesquioxane polymer (HSQ), methyl silsesquioxane polymer (MSQ), polyphenylene oligomer, methyl doped silica or SiOx(CH3)y or SiCxOyHy or SiOCH, organosilicate glass (SiCOH) and porous SiCOH, silicon oxide, boron nitride, silicon oxynitride and the like. The low-k material may be deposited by using any suitable techniques such as, e.g., chemical vapor deposition. Preferably, the spacer layer 220 has lower wet etch resistance than silicon nitride (SiN). In some embodiments the spacer layer 220 is a SiBCN layer.

Figure 2C:
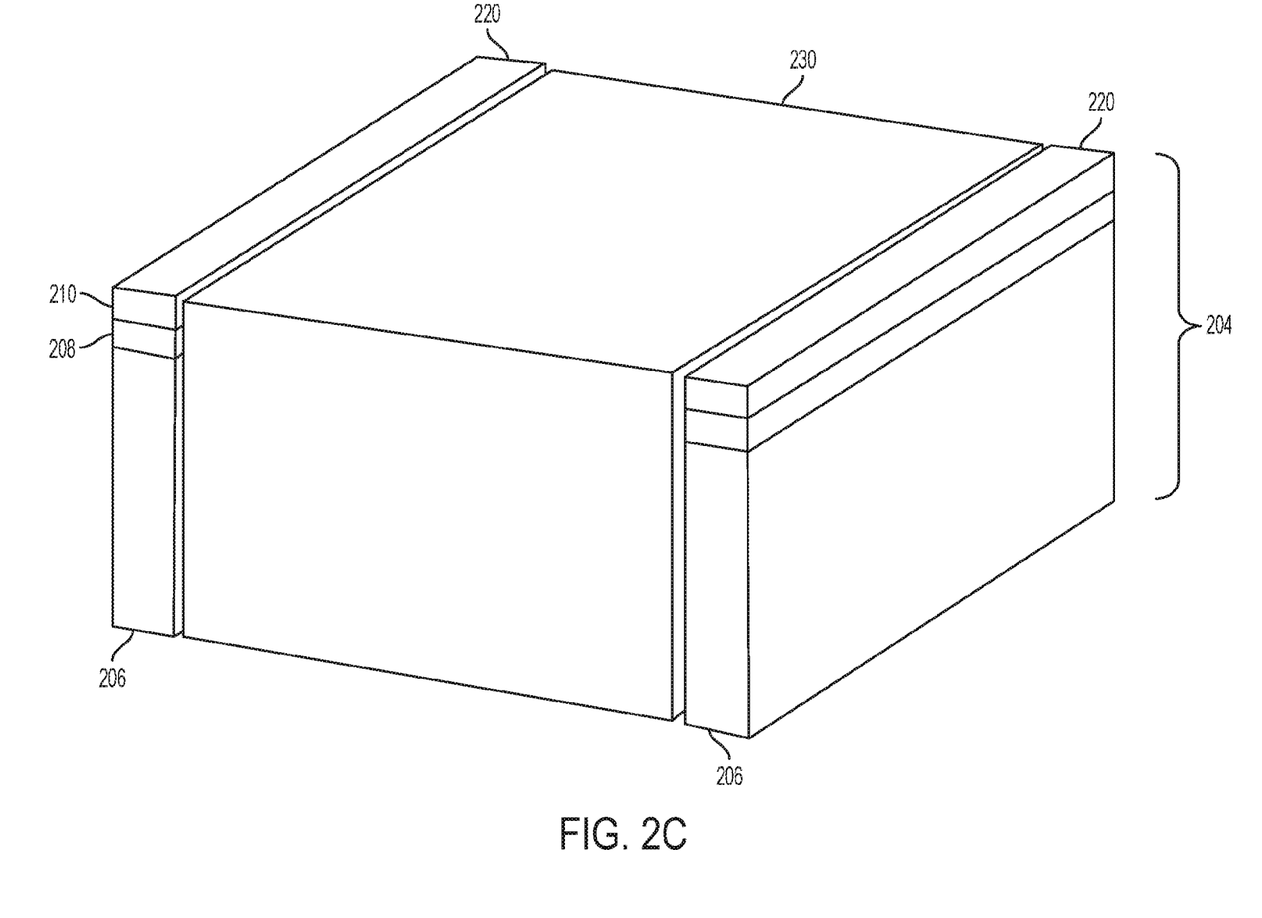
FIG. 2C is a perspective view of a FinFET device after depositing a sacrificial fill material on the device according to an exemplary embodiment.

Then, as illustrated in FIG. 2C, the exemplary method includes depositing a sacrificial fill material 230 on the finFET device. The sacrificial fill material 230 is selective against the liner 220 in hot ammonia. In some embodiments, the sacrificial fill material 230 is not a FCVD fill material. In preferred embodiments, the sacrificial fill material 230 is a polysilicon material or amorphous silicon. In some embodiments, a steam annealing process can be used. The sacrificial fill material 230 is then recessed to the level of the liner 220 on top of the gate stacks, for example by chemical mechanical planarization (CMP). Optionally, the exemplary method next includes depositing a SiO cap on the sacrificial fill material 230.

Figure 2D:
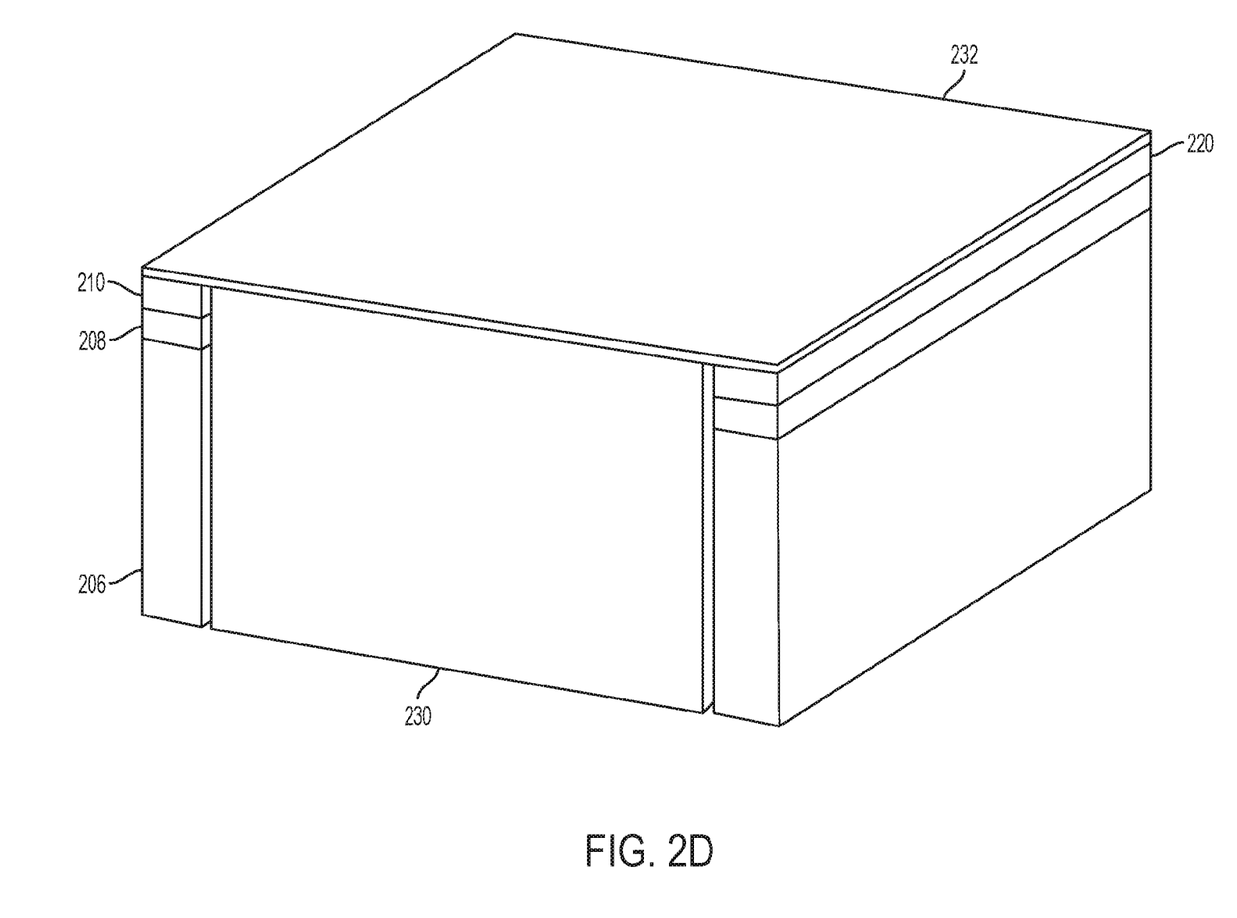
FIG. 2D is a perspective view of a FinFET device after depositing a hard mask according to an exemplary embodiment.

Next, as shown in FIG. 2D, a second hard mask 232 is deposited on the finFET device. In some embodiments, the second hard mask 232 comprises nitride. In some embodiments, the second hardmask is composed of silicon nitride (SiN). In some embodiments, the second hardmask has a thickness of 5 nm to 50 nm, such as from 5 nm to 40 nm, or from 10 nm to 40 nm.

Figure 2E:
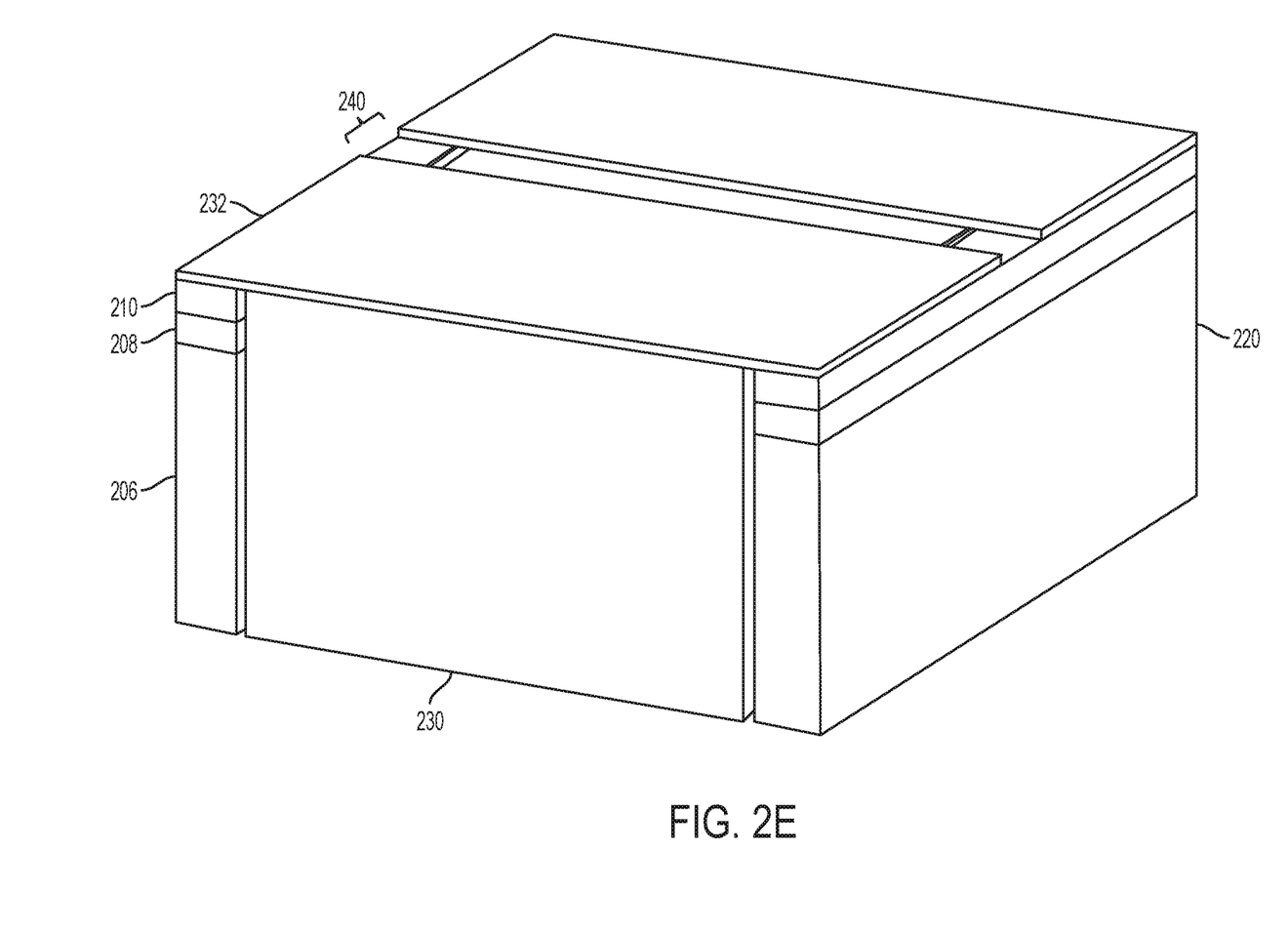
FIG. 2E is a perspective view of a FinFET device after patterning a trench area in the hard mask according to an exemplary embodiment.

Then, as illustrated in FIG. 2E, a trench area 240 is created in the nitride layer 232 and optional oxide cap. The trench area 240 can be generated, for example, by patterning with the use of one or more masks that are used to define the contours of the active areas, which include areas that are desired to have epitaxial source or drain. In some embodiments, the trench is parallel to the first transistor fins and/or the second transistor fins. In some embodiments, the trench is equidistant from the first transistor fins and second transistor fins.

Figure 2F:
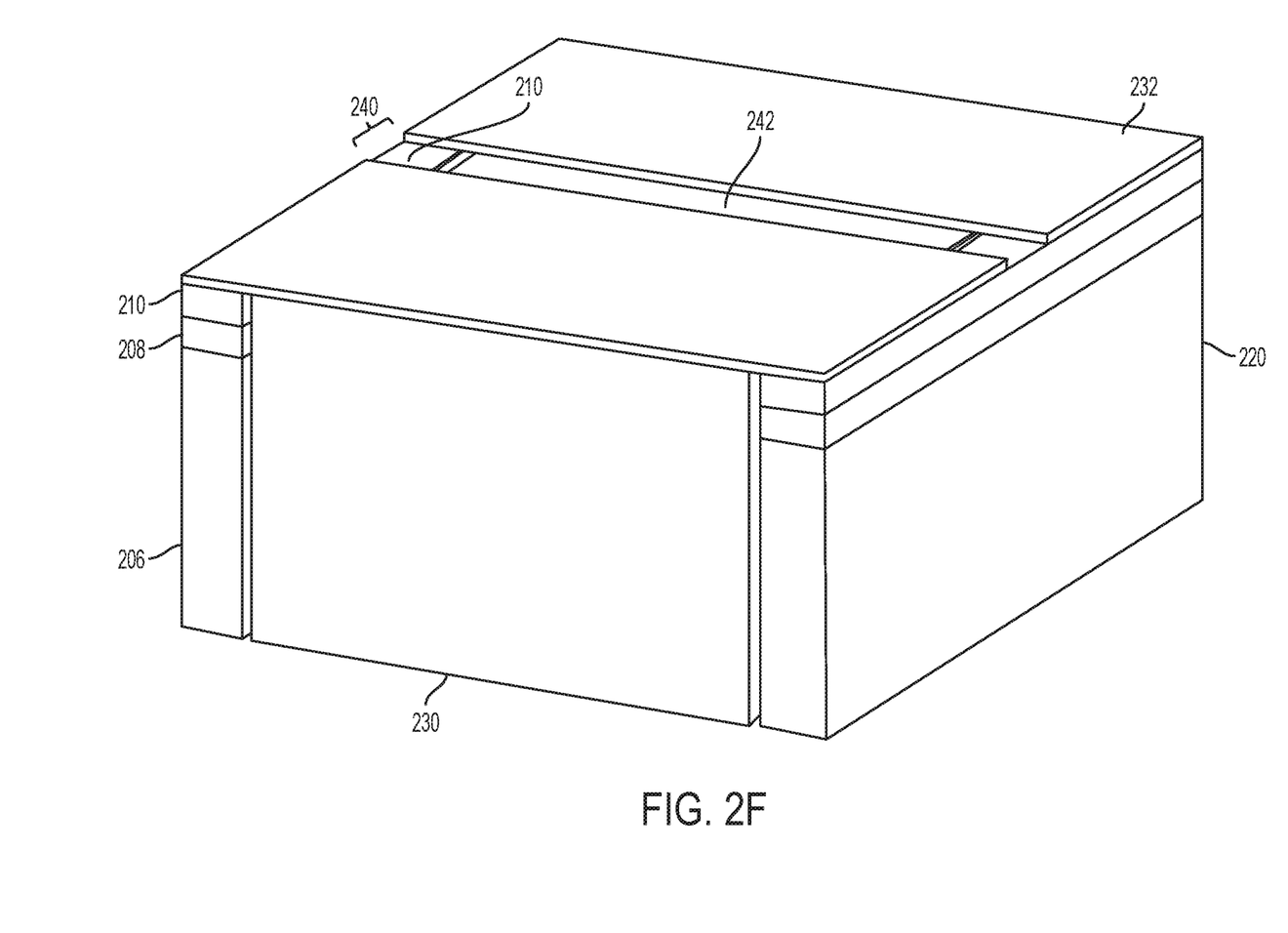
FIG. 2F is a perspective view of a FinFET device after anisotropically etching the sacrificial fill material to create a trench according to an exemplary embodiment.

Then, as illustrated in FIG. 2F, the sacrificial fill material 230 in the trench area 240 is removed by anisotropic etching to create a sacrificial fill trench 242, which is a void in the sacrificial fill material in the area directly beneath the trench area 240. The anisotropic etch is selective against surrounding dielectric materials.

Figure 2G:
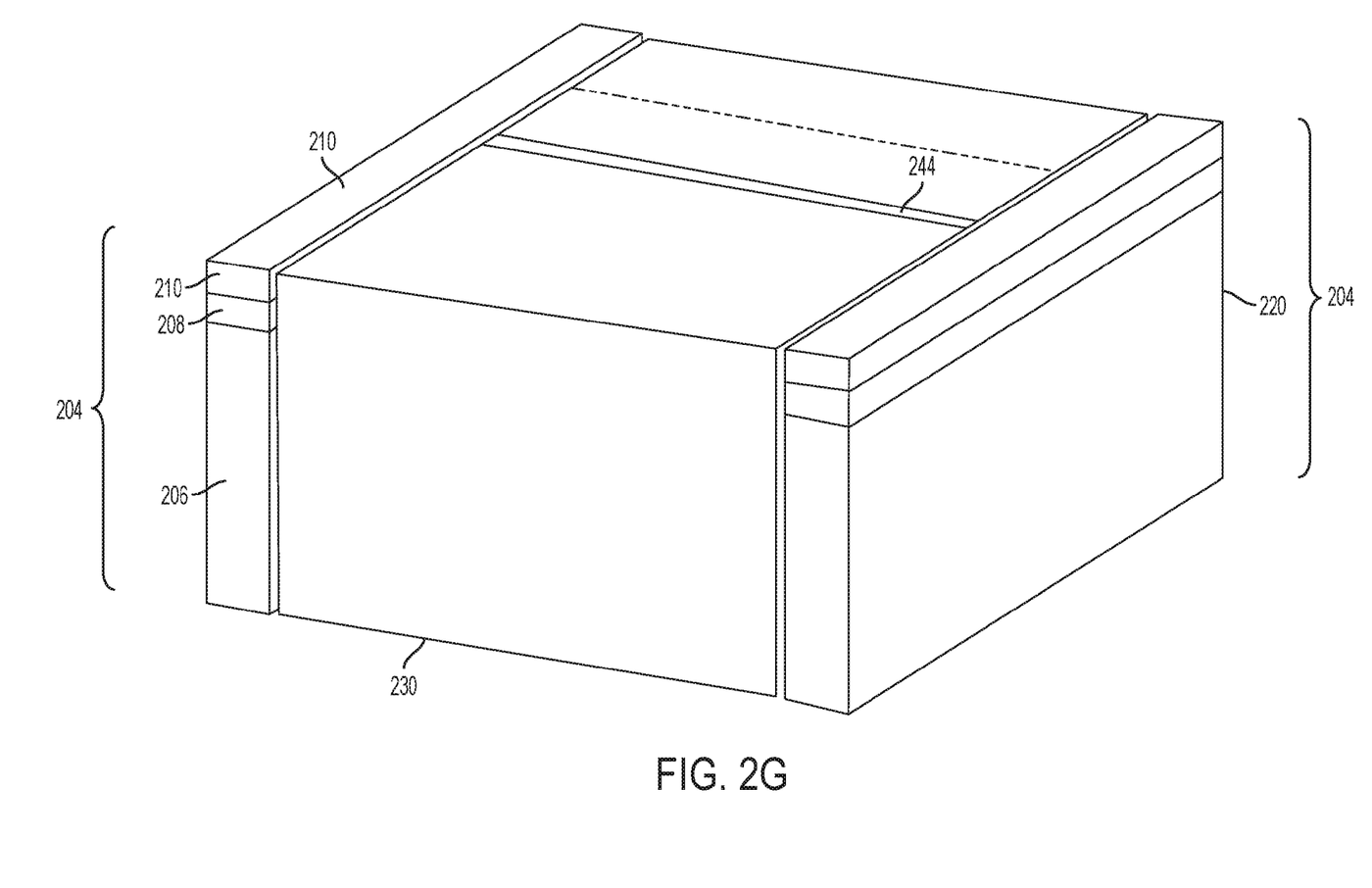
FIG. 2G is a perspective view of a FinFET device after forming a dielectric wall in the trench according to an exemplary embodiment.

Next, the exemplary method includes forming a dielectric or insulator, such as, for example, $SiO_2$ ($SiO_x$) wall in the trench, as illustrated in FIG. 2G. The $SiO_2$ wall can be grown, for example, by conformal $SiO_2$ deposition wherein the wall material grows from any of the walls surrounding the trench and is pinched off in the middle of the trench. Thereafter, the second hard mask can be removed from the device, for example by CMP or etching to the top of the oxide layer 210.

Figure 2H:
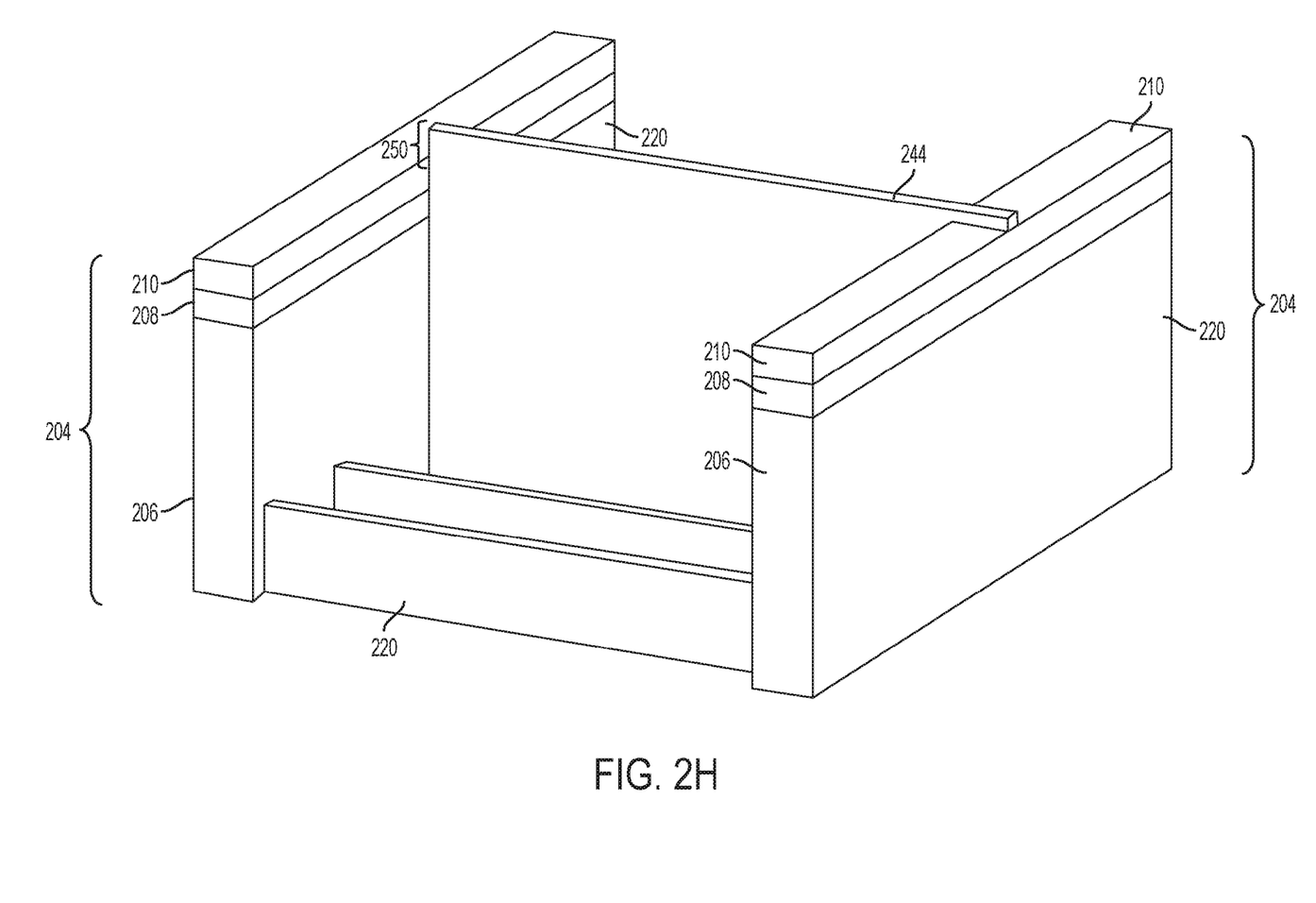
FIG. 2H is a perspective view of a FinFET device after selectively removing the sacrificial fill material according to an exemplary embodiment.

Then, as illustrated in FIG. 2H, ammonia can be deposited on the finFET device to selectively remove the sacrificial fill material. After removal of the sacrificial fill material, the first hard mask 220 remains on the device and lines the first and second transistor fins and the sides of the gate stacks 204. The silicon oxide wall 244 separates the lined first and second transistors (not shown) and is perpendicular to the gate stacks 204.

Figure 2I:
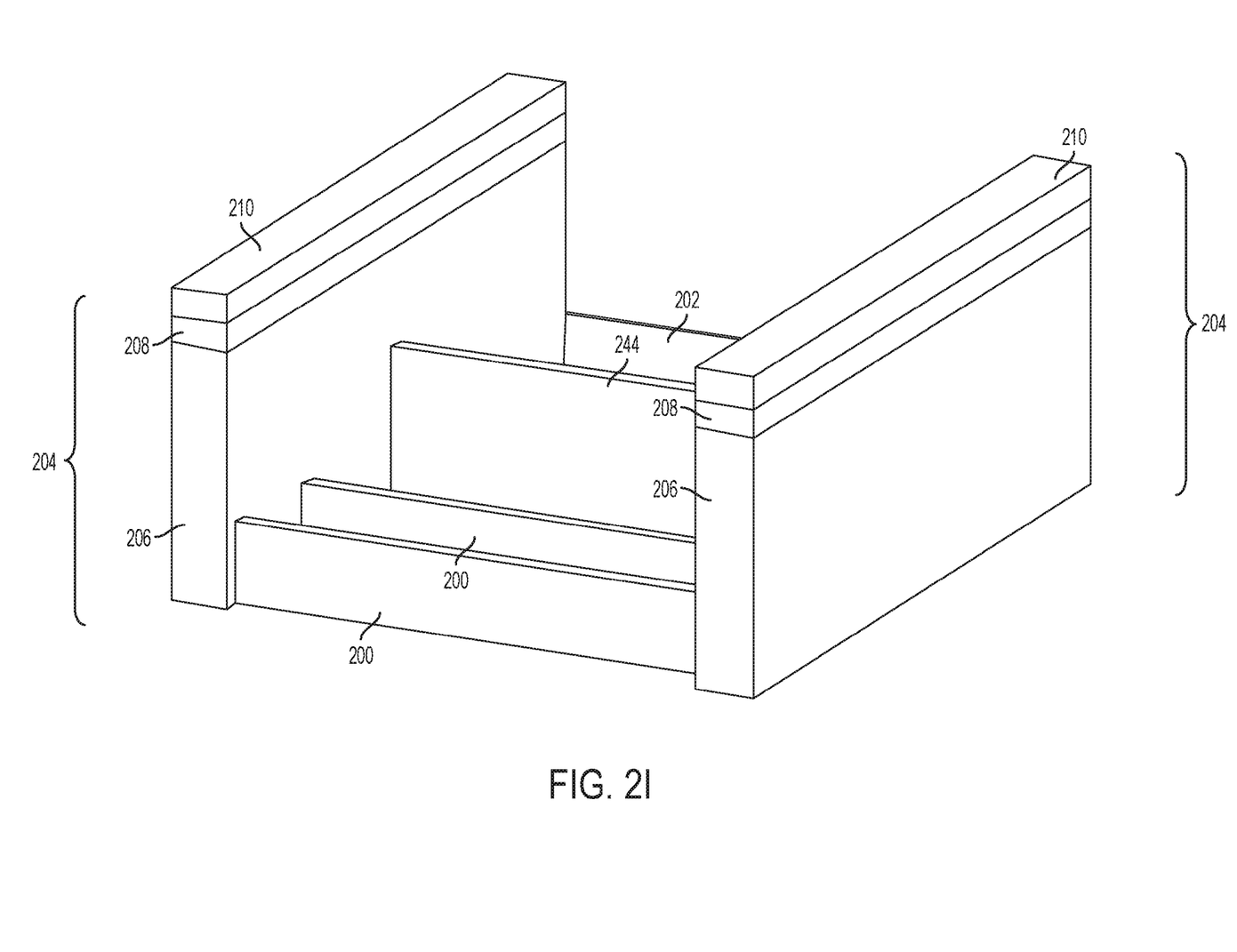
FIG. 2I is a perspective view of a FinFET device after removing the dielectric spacer according to an exemplary embodiment.

Then, as shown in FIG. 2I, the first hard mask can be removed from the device. For example, anisotropic etching can remove the first hard mask and expose the fins 200 and 202 for further processing. In some cases, the silicon oxide wall 244 can partially erode during etching.

In some embodiments, the method also includes growing one or more epitaxial layers on the transistor after formation of the silicon oxide wall 244. An epitaxial growth process may be performed to deposit a crystalline layer onto the crystalline substrate beneath. The epitaxial silicon, silicon germanium, and/or carbon doped silicon (Si:C) can be doped during deposition by adding a dopant or impurity to form a silicide. The epitaxial source/drain may be doped with an n-type dopant or a p-type dopant, which depends on the type of transistor. The epitaxial growth can be physically confined by the silicon oxide wall 244 such that it does not extend into the adjacent transistor. The silicon oxide wall 244 may partially erode during epitaxial growth processes. Thus, the silicon oxide wall 244 should, prior to epitaxial growth, be of a height in excess of the height required to confine the epitaxial layer, such as a height greater than the expected height of the epitaxial layer.

Figure 3:
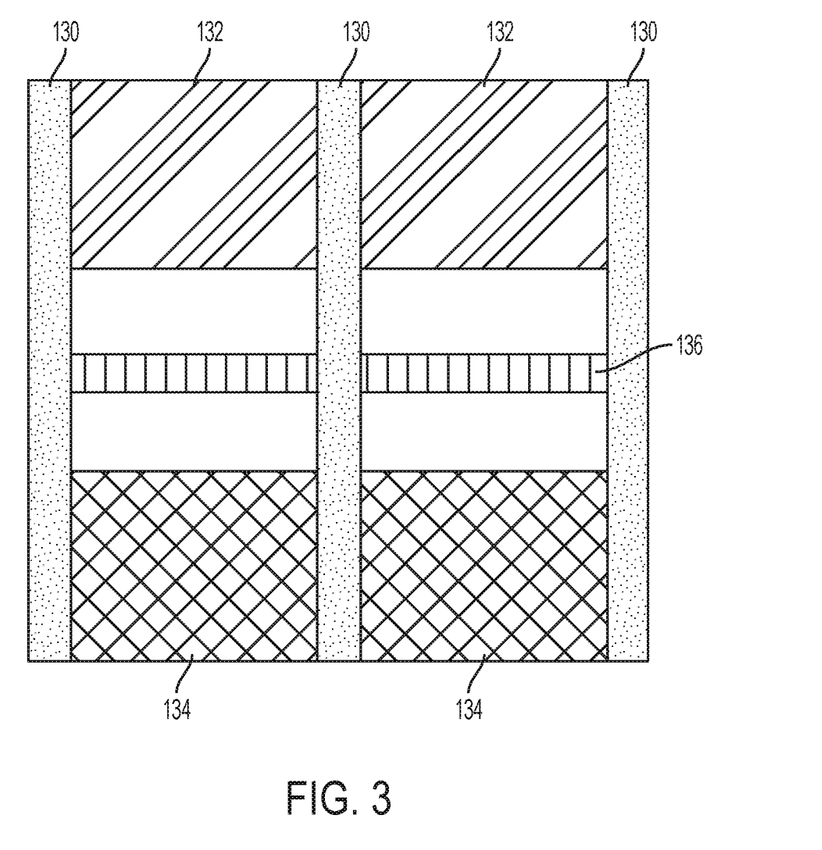
FIG. 3 illustrates a top down view of a CMOS device according to an exemplary embodiment.

The disclosure also relates to a CMOS transistor. For example, with reference to FIG. 3, a CMOS transistor of the disclosure includes a plurality of gate stacks 130, a first transistor active area 132, and a second transistor active area 134. In some embodiments, the gate stacks 130 include sacrificial gates. The CMOS transistor includes a dielectric wall 136 positioned between the first transistor active area 132 and the second transistor active area 134. The transistor active areas can include transistor fins (not shown). In some embodiments, the dielectric wall is an $SiO_2$ wall. In some embodiments, the dielectric wall 136 is perpendicular to the gates 130. The dielectric wall 136 can provide a physical barrier between the first and second transistor active areas 132, 134. In some embodiments, the dielectric wall 136 is higher than the transistor fins. In some embodiments, the first transistor active area 132 is a pFET active area and the second transistor active area is an nFET active area 134.

In some embodiments, a CMOS transistor comprises one or more epitaxial layers. The epitaxial layers can be confined by the dielectric wall.

Figure 4:
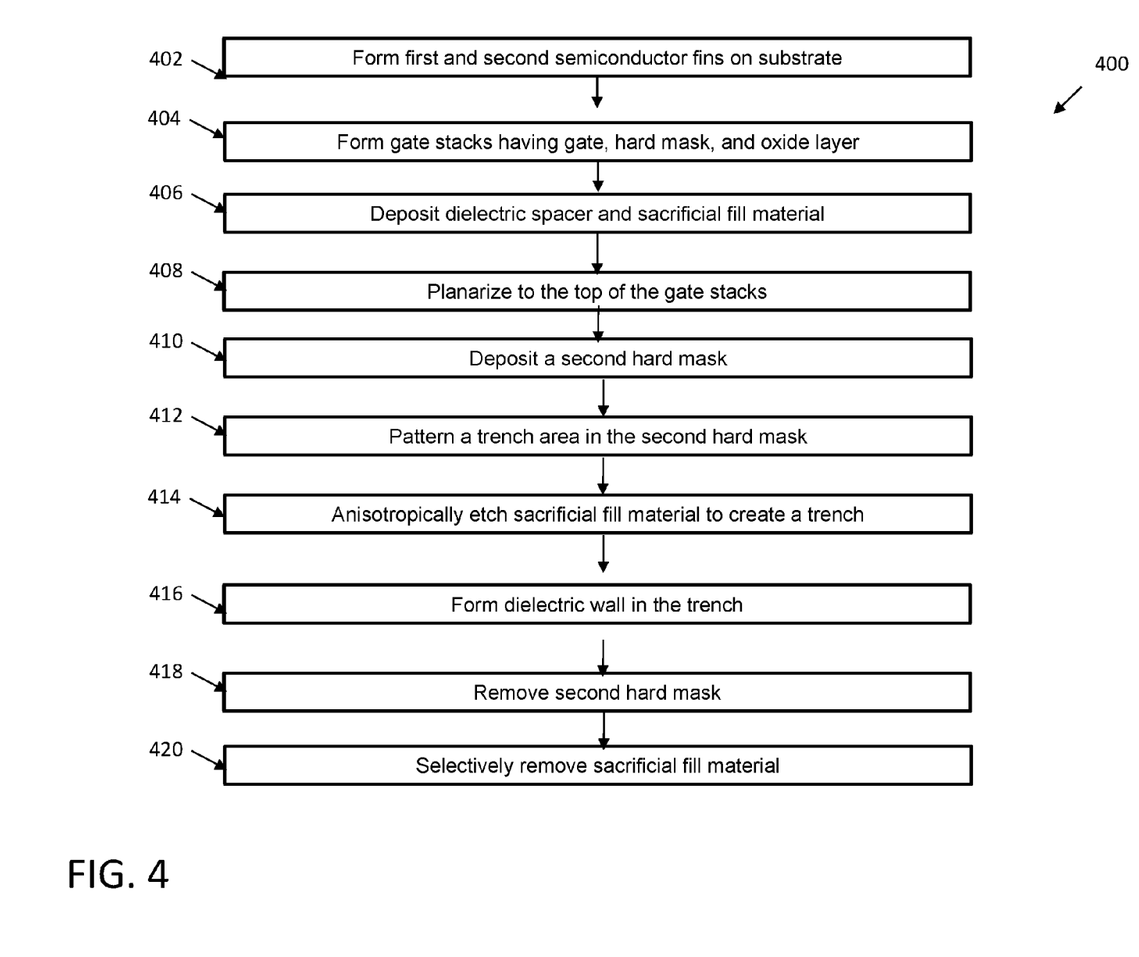
FIG. 4 is a flow diagram of a method for manufacturing a finFET device according to an exemplary embodiment.

FIG. 4 is a flow diagram of a method 400 for manufacturing a finFET device according to an exemplary embodiment. The method 400 includes, as shown at block 402, forming first and second semiconductor fins on a substrate. The method 400 also includes, as shown at block 404, forming gate stacks having gate, hard mask, and oxide layers. Next, as shown at block 406, the method 400 includes depositing a dielectric spacer and a sacrificial fill material on the device. Then, as shown at block 408, the device is planarized to the top of the gate stacks. The method 400 then includes, as shown at block 410, depositing a second hard mask. Then, a trench area is patterned in the second hard mask, as shown at block 412. Next, the method 400 includes anisotropically etching sacrificial fill material to create a trench. Then, as shown at block 416, the method 400 includes forming a dielectric wall in the trench. As shown at block 418, the method 400 next includes removing the second hard mask. As shown at block 420, the method 400 also includes selectively removing the sacrificial fill material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for manufacturing a finFET device, the method comprising:
    forming a plurality of first semiconductor fins on a substrate,
    forming a plurality of second semiconductor fins on a substrate,
    forming one or more gate stacks, each gate stack comprising a gate, a first hard mask, and an oxide layer;
    depositing a low-k dielectric spacer layer on the finFET device;
    depositing a sacrificial fill material on the finFET device;
    planarizing the device with chemical mechanical planarization to the level of the oxide layer on top of the gate stacks;
    depositing a second hard mask on the finFET device;
    patterning a trench area in the second hard mask parallel to the first semiconductor fins and second semiconductor fins;
    anisotropically etching the sacrificial fill material to create a trench;
    forming a dielectric wall in the trench;
    removing the second hard mask from the finFET device; and
    selectively removing the sacrificial fill material.

2. The method according to claim 1, wherein the first semiconductor fins are pFET fins and the second semiconductor fins are nFET fins.

3. The method according to claim 1, wherein the first hard mask comprises a wet etch resistant material.

4. The method according to claim 3, wherein the first hard mask comprises a composite silicon nitride/silicon oxide material.

5. The method according to claim 1, wherein the low-k dielectric spacer layer is a SiBCN layer.

6. The method according to claim 1, wherein the sacrificial fill material is amorphous silicon.

7. The method according to claim 1, further comprising depositing a $SiO_2$ cap on the sacrificial fill material after planarizing the device with chemical mechanical planarization to the level of the liner on top of the gate stacks.

8. The method according to claim 1, wherein the second hard mask comprises SiN.

9. The method according to claim 1, wherein forming the dielectric wall comprises conducting atomic layer deposition.

10. The method according to claim 1, wherein the dielectric wall comprises SiO.

11. The method according to claim 1, further comprising growing at least one epitaxial layer on the first transistor or second transistor by an epitaxial growth process.

12. A method of manufacturing a finFET device, the method comprising:
    patterning a plurality of first fins on a first transistor area and a plurality of second fins on a second transistor area;
    forming two gate stacks, each gate stack comprising sacrificial gate material, a hard mask, and an oxide layer;
    subtractively patterning a dielectric wall between the first fins and second fins; and
    growing a first epitaxial layer on the first transistor area, wherein the first epitaxial layer is confined to the first transistor area by the dielectric wall.

13. The method of claim 12, the method further comprising growing a second epitaxial layer on the second transistor area.

14. The method of claim 12, wherein the dielectric wall comprises silicon oxide.

* * * * *